(12) United States Patent
Liou et al.

(10) Patent No.: US 9,379,061 B2
(45) Date of Patent: Jun. 28, 2016

(54) HIGH DENSITY DIELECTRIC ETCH-STOP LAYER

(71) Applicant: Taiwan Semiconductor Manufacturing Co., Ltd., Hsin-Chu (TW)

(72) Inventors: Joung-Wei Liou, Zhudong Township (TW); Han-Ti Hsiaw, Zhubei (TW); Keng-Chu Lin, Ping-Tung (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 0 days.

(21) Appl. No.: 14/791,571

(22) Filed: Jul. 6, 2015

(65) Prior Publication Data

US 2015/0311158 A1 Oct. 29, 2015

Related U.S. Application Data

(62) Division of application No. 14/045,054, filed on Oct. 3, 2013, now Pat. No. 9,076,845.

(51) Int. Cl.
| | |
|---|---|
| *H01L 23/48* | (2006.01) |
| *H01L 23/52* | (2006.01) |
| *H01L 29/40* | (2006.01) |
| *H01L 23/532* | (2006.01) |
| *H01L 21/768* | (2006.01) |
| *H01L 23/538* | (2006.01) |
| *H01L 21/48* | (2006.01) |
| *H01L 23/522* | (2006.01) |

(52) U.S. Cl.
CPC .......... *H01L 23/5329* (2013.01); *H01L 21/486* (2013.01); *H01L 21/76825* (2013.01); *H01L 21/76826* (2013.01); *H01L 21/76829* (2013.01); *H01L 23/5226* (2013.01); *H01L 23/5384* (2013.01); *H01L 23/53228* (2013.01); *H01L 23/53295* (2013.01); *H01L 2924/0002* (2013.01)

(58) Field of Classification Search
CPC ......... H01L 23/48; H01L 23/52; H01L 29/40; H01L 21/76829; H01L 21/486; H01L 23/5384
USPC ................. 257/66, 75, 74; 438/426, 478, 487
See application file for complete search history.

(56) References Cited

U.S. PATENT DOCUMENTS

| | | | | |
|---|---|---|---|---|
| 6,162,737 | A * | 12/2000 | Weimer et al. | 438/738 |
| 6,348,407 | B1 | 2/2002 | Gupta et al. | |
| 6,603,204 | B2 * | 8/2003 | Gates et al. | 257/760 |
| 6,764,951 | B1 * | 7/2004 | van Ngo | 438/687 |
| 7,326,444 | B1 * | 2/2008 | Wu et al. | 427/579 |

(Continued)

OTHER PUBLICATIONS

Non-Final Office Action dated Dec. 5, 2014 for U.S. Appl. No. 14/045,054.

(Continued)

*Primary Examiner* — Phuc Dang
(74) *Attorney, Agent, or Firm* — Eschweiler & Associates, LLC

(57) ABSTRACT

Some embodiments of the present disclosure relate to an integrated circuit device. The integrated circuit device includes a semiconductor substrate, and an inter-level dielectric layer arranged over the semiconductor substrate. An etch-stop layer is arranged over the inter-level dielectric layer. The etch-stop layer comprises silicon oxide, silicon nitride, or silicon oxynitride, and has a density greater than or equal to 2.15 g/cm$^3$.

20 Claims, 5 Drawing Sheets

(56) References Cited

U.S. PATENT DOCUMENTS

| | | | |
|---|---|---|---|
| 7,557,035 B1* | 7/2009 | Ryan et al. | 438/638 |
| 2005/0263876 A1* | 12/2005 | Yew et al. | 257/701 |
| 2009/0085042 A1 | 4/2009 | Mine et al. | |
| 2014/0138750 A1* | 5/2014 | Wu et al. | 257/288 |
| 2014/0264931 A1* | 9/2014 | Wang et al. | 257/774 |

OTHER PUBLICATIONS

Notice of Allowance dated Mar. 5, 2015 for U.S. Appl. No. 14/045,054.

* cited by examiner

HIGH DENSITY DIELECTRIC ETCH-STOP LAYER

REFERENCE TO RELATED APPLICATION

This Application is a Divisional of U.S. application Ser. No. 14/045,054 filed on Oct. 3, 2013, which has now issued as U.S. Pat. No. 9,076,845, the contents of which are incorporated by reference in their entirety.

FIELD

The present disclosure relates to integrated circuit devices and a method of manufacturing them.

BACKGROUND

Many years of research have been devoted to reducing the critical dimensions (CDs) and structure densities of integrated circuits (ICs). High density integrated circuits are typically formed using a large number of process steps that involve etching through openings in lithographic masks. Misalignment of masks and over-etching can lead to device defects.

DETAILED DESCRIPTION

The inventors solved a problem of over-etching when forming vias in a low-k dielectric layer located above an inter-layer dielectric with an etch stop layer of compressed silicon-based dielectric. The compressed layer is formed by depositing a thin layer of silicon over the inter-layer dielectric, forming another layer over the thin silicon layer to fix the thin silicon layer from above, then allowing oxygen and or nitrogen to diffuse into and react within the thin silicon layer to transform the thin silicon layer into a silicon-based dielectric layer. The silicon-based dielectric layer would normally take up a larger volume than the thin silicon layer. Because the shape of the thin silicon layer is constrained from above and below prior to its transformation into a dielectric, the dielectric forms as a compressively stressed layer with a higher than normal density. The high density dielectric has a higher etch resistance than a normal density dielectric and exhibits superior performance as an etch stop layer.

Figure 1:
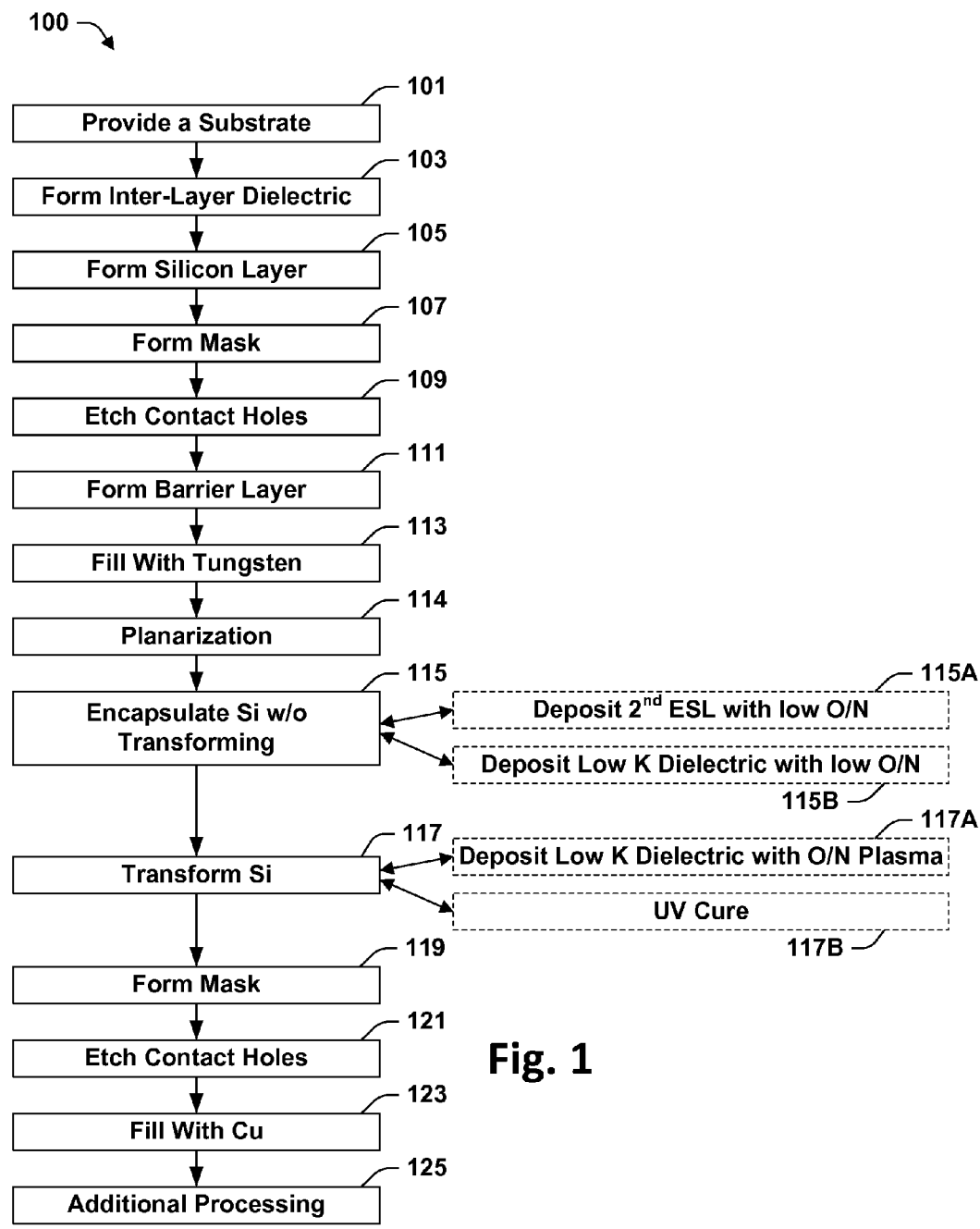
FIG. 1 is a flow chart of a process provided by an embodiment of the present disclosure.
Figure 11:
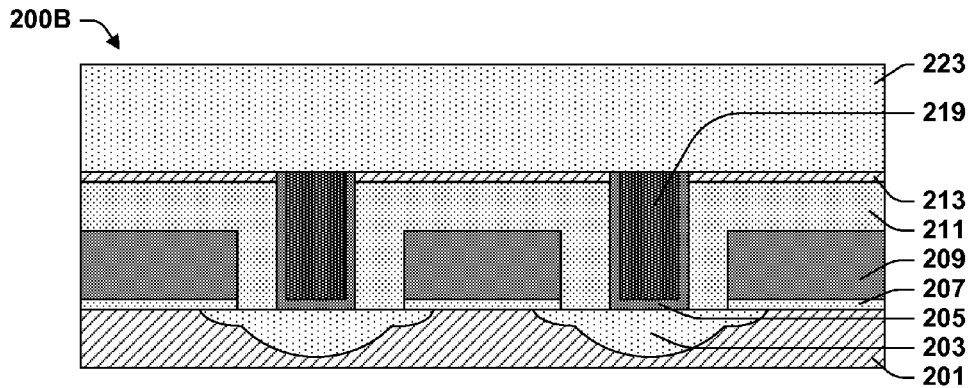
FIGS. 11-13 illustrate another device provided by a further embodiment of the present disclosure as it undergoes manufacture by a process shown in FIG. 1.
Figure 12:
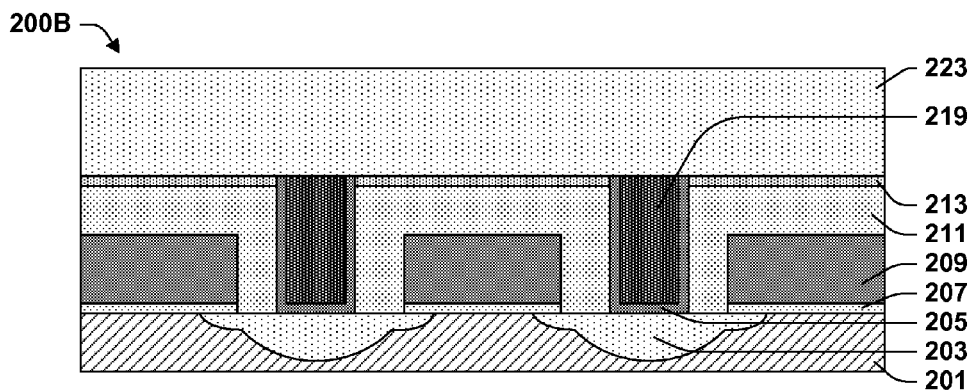
Figure 13:
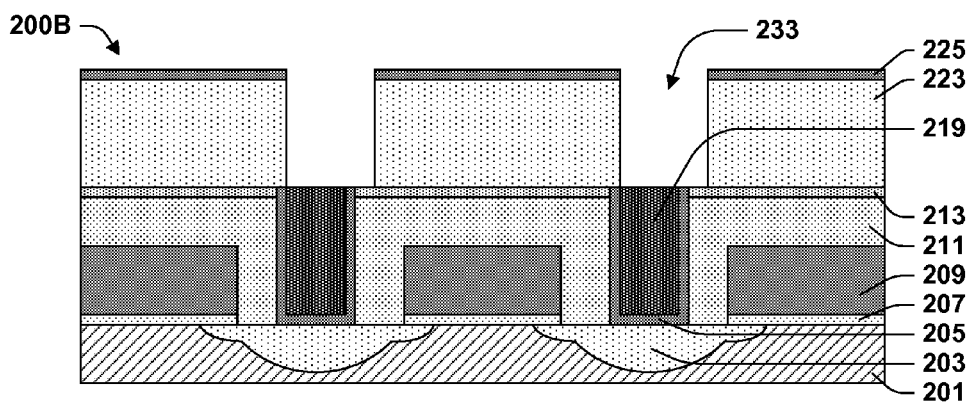

FIG. 1 illustrates a manufacturing process 100 according to an embodiment of the present disclosure. FIGS. 2-10 illustrate a device 200, which is an example according to another embodiment of the present disclosure, undergoing manufacture by the process 100. FIGS. 11-13 illustrate a device 200A which can also be manufactured by the process 100, and which is an example according to a further embodiment of the present disclosure.

Figure 2:
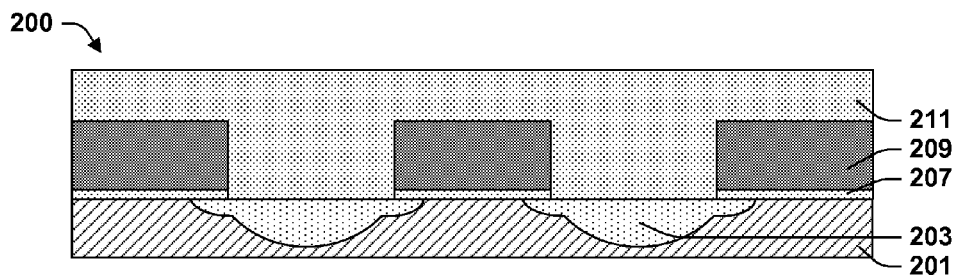
FIGS. 2-10 illustrate a device provided by an embodiment of the present disclosure as it undergoes manufacture by a process shown in FIG. 1.

The process 100 begins with act 101, providing a semiconductor substrate. The semiconductor substrate generally includes a semiconductor body 201 with various structures formed thereon and therein. Examples of semiconductor substrates include, without limitation, silicon and silicon on insulator (SOI). Semiconductor body 201 can be any suitable semiconductor. Examples of semiconductors include, without limitation, Si, Ge, GaAs, GaAlAs, InP, GaN and SiGe. Structures formed thereon and therein can include, without limitation, memory devices, logical devices, FETs and components thereof such as source regions, drain regions, and gate electrodes, active devices, passive devices, and combinations thereof. With reference to FIG. 2, in some embodiments the structures include transistors having gates 209 separated from semiconductor body 201 by gate dielectric 207. Doped regions 203 within semiconductor body 201 provide source/drain regions for the transistors. Process 100 continues with act 103, which covers the source/drain regions 203 and the gates 209 with an inter-level dielectric layer 211 as shown in FIG. 2. Inter-level dielectric layer 211 can have any suitable composition and can be formed by any suitable process.

Act 105 forms a transformative layer 213 over the inter-layer dielectric 211. Transformative layer 213 is a layer of material that can undergo a volume-increasing chemical transformation. In most embodiments, the transformative layer is amorphous silicon. Amorphous silicon can be transformed by chemical reaction with oxygen and or nitrogen into a silicon oxide, a silicon nitride, or a silicon oxynitride. Any of these transformations would be volume-increasing if carried out in bulk (as opposed to a thin film) under constant temperature and pressure.

The transformative layer 213 can be formed by any suitable process. Suitable processes for forming an amorphous silicon layer include, without limitation, plasma-enhanced chemical vapor deposition (PECVD), physical vapor deposition (PVD), and atomic layer deposition (ALD). In most embodiments, the transformative layer 213 is formed at a temperature of 500° C. or less, 350° C. for example.

Figure 3:
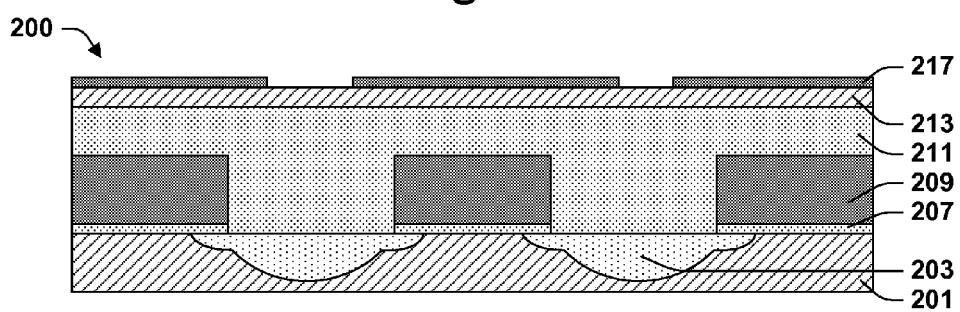
Figure 4:
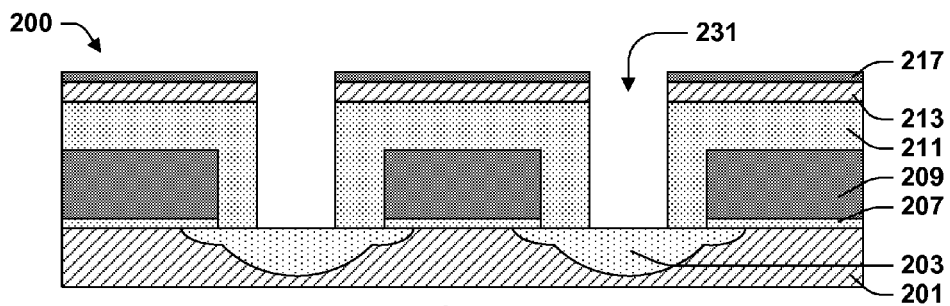
Figure 5:
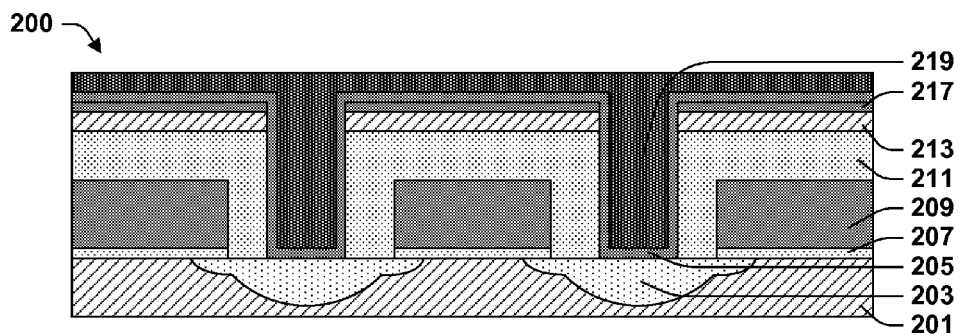

Act 107 forms a mask 217 over transformative layer 213 as shown in FIG. 3. The mask 217 has openings corresponding to desired locations for contacts with source/drain regions 203, for example. Act 109 etches transformative layer 213 and interlayer dielectric 211 through opening in mask 217 to form contact holes 231 as shown in FIG. 4. Act 111 forms a diffusion barrier 205, which lines contact holes 231, and act 113 fills contact holes 231 with metal 219 to produce a structure as shown in FIG. 5. Any suitable metal can be used. In some embodiments, the metal is tungsten.

Figure 6:
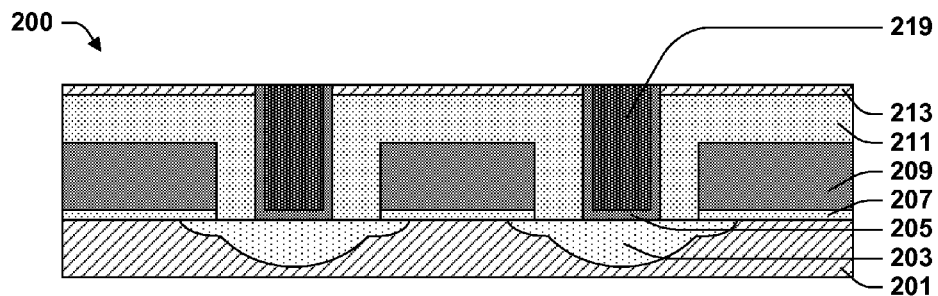

Act 114 is planarization, which is generally chemical mechanical polishing. Planarization 114 removes metal 219, diffusion barrier 205, and mask 217 from where they lie atop transformative layer 213. At the conclusion of planarization 114, an upper surface of transformative layer 213 is exposed and coplanar with an upper surface of metal plugs 219 as shown in FIG. 6. This configuration is useful for making transformative layer 213 an etch stop for etching holes in subsequent layers for contact down to the metal plugs 219, as will be more fully appreciated below. In most embodiments, to provide an effective etch stop, transformative layer 213 is at least 50 Å thick.

Following act 114, and generally before as well, transformative layer 213 is a thin layer that adheres to inter-layer dielectric 213. Thinness of the transformative layer 213 and the adhesion to inter-layer dielectric 213 contribute to the densification of transformative layer 213 by volume-increasing chemical reaction. In this context, a thin layer is generally less than 300 Å thick. In most embodiments, transformative layer 213 is less than 200 Å thick. In typical embodiments, transformative layer 213 is 100 Å thick or less.

Act 115 forms a protective layer over transformative layer 213 under conditions selected to avoid substantially transforming transformative layer 213. For example, if transformative layer 213 is originally an amorphous silicon layer, following act 115, transformative layer 213 is either still amorphous silicon or is a silicon oxide, a silicon nitride, or a silicon oxynitride that is low in oxygen and nitrogen content. In most embodiments, an amorphous silicon transformative layer 213 will remain very low in oxygen and nitrogen content following act 115. Following partial oxidation and or nitridation, amorphous silicon becomes silicon oxide, silicon nitride, or silicon oxynitride any of which can be represented by the formula $SiO_XN_Y$. In a typical dielectric of silicon oxide, silicon nitride, or silicon oxynitride, X+Y is in the range from 1 to 2. If X+Y is less than 0.5, then the oxygen and nitrogen content can be considered low. If X+Y is less than 0.2, then the oxygen and nitrogen content is very low. In typical embodiments, X+Y is 0.05 or less following act 115. Less transformation prior to encapsulation allows for a greater transformation following encapsulation.

The protective layer can be any layer that adheres to transformative layer 213 and resists its expansion when undergoing a volume-increasing transformation. Following act 115, transformative layer 213 is encapsulated by adherent layers above and below it. The protective layer can permit diffusion of species necessary for a subsequent volume-increasing reaction of transformative layer 213.

Figure 7:
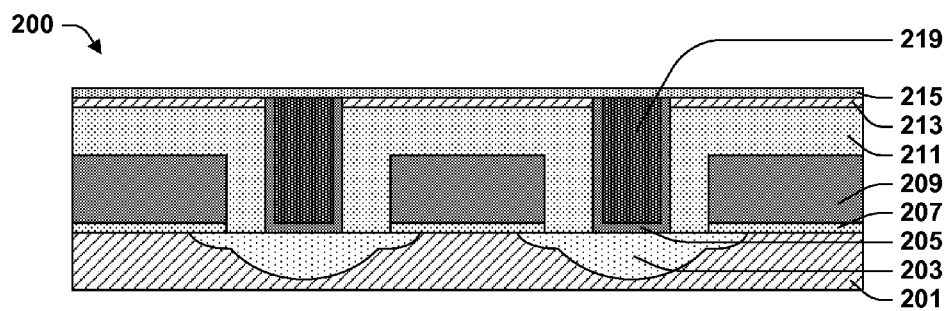

FIG. 1 illustrates two of the possibilities for act 115. Act 115A illustrates embodiments in which the protective layer is etch stop layer 215 as shown in FIG. 7. Etch stop layer 215 can have any suitable composition consistent with forming that layer without causing substantial transformation of transformative layer 213. Examples of suitable compositions for etch stop layer 215 include compositions of the form $SiO_XN_Y$ and $SiC_ZO_XN_Y$. In most embodiments, achieving the objective of forming etch stop layer 215 without causing substantial transformation of layer 213 results in etch stop layer 215 having a composition that is low in combined oxygen and nitrogen content in comparison to typical etch stop layers for which a dielectric quality is desired. A low combined oxygen and nitrogen content is generally an atomic fraction less than 0.33. In most embodiments, etch stop layer 215 is formed with an atomic fraction of oxygen and nitrogen that is less than 0.10. In typical embodiments, the combined atomic fraction is 0.05 or less, e.g., SiO with an Si:O ratio of about 0.05. At low oxygen and nitrogen content, etch stop layer 215 may have an undesirably high dielectric constant. In those embodiments, etch stop layer 215 can be subsequently oxidized and or nitridized with the same process (act 117) that causes transformation of transformative layer 213.

In some embodiments, etch stop layer 215 is formed by plasma enhanced chemical vapor deposition (PECVD). If transformative layer 213 is amorphous silicon, the plasma is kept low in oxygen and nitrogen ions as necessary to avoid substantially transforming transformative layer 213. Keeping the plasma low in oxygen and nitrogen ions generally means keeping the ratio of oxygen and nitrogen atoms to silicon atoms at 0.25 or less. In most embodiments the ratio of oxygen and nitrogen atoms to silicon atoms in the plasma will be 0.10 or less. In typical embodiments, the ratio of oxygen and nitrogen atoms to silicon atoms in the plasma is 0.05 or less.

FIG. 1 also illustrates act 115B, another of the possibilities for act 115. Act 115B provides an example of embodiments in which the protective layer is a low-k dielectric layer 223 as shown in FIG. 11. If formed by act 115B, low-k dielectric layer 223 can be any suitable low-k dielectric that can be formed into an adherent layer over transformative layer 213 without causing substantial transformation of that layer. Examples of low-k dielectrics that can be suitable include organosilicate glasses (OSG) such as carbon-doped silicon dioxide, fluorine-doped silicon dioxide (otherwise referred to as fluorinated silica glass (or FSG)), and organic polymer low-k dielectrics.

In some embodiments act 115B forms low-k dielectric layer 223 low in oxygen content. A low oxygen content for a low-k dielectric is generally an O to Si ratio of 1:3 or less. In some embodiments, low-k dielectric layer 223 has an O to Si ratio of 1:4 or less, e.g., 1:5. An ordinary organosilicate glass typically has an SiO to SiC ratio of 3:1. In some of the embodiments for which act 115B forms an organosilicate glass low-k dielectric layer 223, avoiding substantial transformation of layer 213 results in low-k dielectric layer 223 having an SiO to SiC ratio that is 2:1 or less. In typical embodiments, act 115B forms a low-k dielectric layer 223 having an SiO to SiC ratio in the range from 1:1 to 1:2. In some embodiments, these low oxygen concentrations remain in the device 200 through production. In some other embodiments, these oxygen concentrations are increased by subsequent treatment.

In some embodiments, act 115B forms low-k dielectric layer 223 by PECVD. If transformative layer 213 is amorphous silicon, the plasma is kept low in oxygen and nitrogen ions as necessary to avoid substantially transforming transformative layer 213. PECVD can be carried out in a chamber suitable for chemical vapor deposition (CVD). The plasma may be generated using radio frequency (RF) power or other techniques. To form an organosilicate glass, the chamber can be supplied with a suitable organosilicon compound. A suitable organosilicon compound can be, for example methyldiethoxysilane (mDEOS, $CH_3$—$SiH$—$(OCH_2CH_3)_2$), 1,3-dimethyldisiloxane ($CH_3$—$SiH_2$—O—$SiH_2$—$CH_3$), 1,1,3,3-tetramethyldisiloxane ((($CH_3)_2$—$SiH$—O—$SiH$—$(CH_3)_2$), bis(1-methyldisiloxanyl)methane (($CH_3$—$SiH_2$—O—$SiH_2$—$)_2$—$(CH_2)$), or 2,2-bis(1-methyldisiloxanyl)propane ($CH_3$—$SiH_2$—O—$SiH_2$—$)_2$—$C(CH_3)_2$. Whereas an ordinary PECVD process would use an oxygen source such as $O_2$ or $O_3$ at a concentration of at least 10%, some embodiments use a PECVD process with an $O_2$ or $O_3$ at a concentration of 5% or less. In some embodiments, a porogen is included with the PECVD process to lower the effective dielectric constant of low-k dielectric layer 223. The porogen could be, for example, Alpha-terpenine (ATRP).

In some embodiments, act 115B forms low-k dielectric layer 223 by a flowable process, which is a process in which at least one of the low-k dielectric precursors is allowed to flow over the surface of transformative layer 213. In some embodiments, the flowable process employs a flowable silicon precursor. Examples of flowable silicon precursors that can be suitable for act 115B include trisilylamine (TSA) and hydrogen silsesquioxane (HSQ). In some embodiments, the flowable precursor interacts with a treatment gas to form low-k dielectric layer 223. In some embodiments, the flowable precursor protects transformative layer 213 from a reaction with the treatment gas that would cause a substantial transformation of transformative layer 213. In some embodiments, the treatment gas includes little or no oxygen. The treatment gas can include ions formed by a plasma. In some embodiments, the treatment gas includes ions of the form $NH_X^-$. In some embodiments a porgen, ATRP for example, is included in the flowable process.

Process 100 continues with act 117, causing a volume-increasing chemical reaction within transformative layer 213. At this stage of process 100, the shape of transformative layer 213 is constrained by adherent layers above and below.

Because transformative layer 213 is thin and constrained in this way, the increase in specific volume is less than would occur in a thick or unconstrained transformative layer 213. As a consequence, transformative layer 213 comes under compressive stress from the adjacent layers and develops a significantly higher than normal density for its composition. It is possible that the volume-increasing transformation does not result in any perceptible increase in the volume of transformative layer 213, the effect being manifest instead by an increase in compressive stress within transformative layer 213.

A significantly higher than normal density is one that results in a significantly higher etch resistance than the normal density material. A density 0.05 g/cm$^3$ or more greater than the density in an uncompressed state is generally a significantly higher than normal density. For a material of the form $SiO_xN_y$, a density greater than or equal to 2.15 g/cm$^3$ is significantly higher than normal. In some embodiments, act 117 increases the density of an $SiO_xN_y$ transformative layer 213 to within the range from 2.25 g/cm$^3$ to 2.50 g/cm$^3$. In most embodiments, following act 117, the transformative layer 213 is transformed to a high density material having an etch resistance at least 50% higher than an equivalent material that is not under significant compressive stress. In some embodiments, following act 117, the transformed layer 213 has an etch resistance at least double that of an equivalent material that is not under significant compressive stress. An increase in etch resistance can be assessed by etching samples with a $CHF_3/O_2$ plasma, an $Ar/N_2$ carrier gas, at 60° C., a pressure of 100 mT, and other conventional plasma etching conditions. While these specific conditions are offered to provide a consistent basis for comparing etch resistances, the increase in etch resistance will be realized over a broad range of etching conditions.

Figure 8:
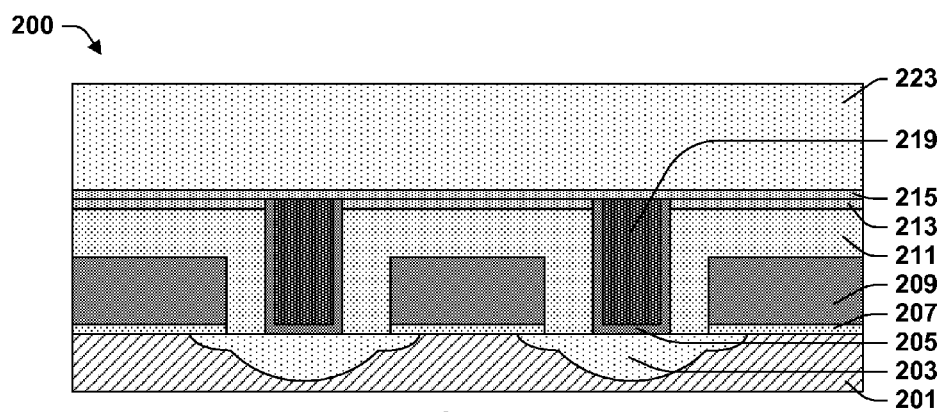

FIG. 1 illustrates two options for act 117, one or both of which can be employed. Act 117 results in a structure as shown in FIG. 8 if act 115A has been employed to form etch stop layer 215, and a structure as shown in FIG. 12 if not. Act 117A is illustrative of embodiments in which transformation can be induced while forming low-k dielectric layer 223. These embodiments are generally ones in which etch stop layer 215 has been formed by act 115A. Although low-k dielectric layer 223 is generally formed by just one of acts 115B and 117A, it is possible to begin forming low-k dielectric layer 223 using conditions required by act 115B and to complete forming low-k dielectric layer 223 using conditions required by act 117A. Process 100 forms low-k dielectric layer 223 in any case.

While act 115B uses conditions selected to avoid substantive transformation of transformative layer 213, act 117A does not have this restriction. Act 117A can form a low-k dielectric layer 223 that is not particularly low in oxygen or nitrogen content, regardless of the composition of transformative layer 213. Act 117A can form low-k dielectric layer 223 by any of the processes provided as examples suitable for act 115B, but without the restrictions as to low oxygen and nitrogen content. In some embodiments, act 117A forms low-k dielectric layer 223 using a plasma that contains oxygen and or nitrogen ions that enter transformative layer 213 and cause it to undergo a volume-increasing transformation. Standard oxygen and or nitrogen ion concentrations used in plasma-enhanced deposition are generally sufficient for this purpose.

In some embodiments, the volume increasing reaction of transformative layer 213 is caused entirely by act 117A. In these embodiments, act 117B is optional unless required to cure low-k dielectric layer 213. In some other embodiments, the volume increasing reaction of transformative layer 213 is caused in part by act 117A and in part by act 117B. In some further embodiments, the volume increasing reaction of transformative layer 213 is caused entirely by act 117B. In these later embodiments, act 117A can be included simply to form low-k dielectric layer 213 over etch stop layer 215.

Act 117B is another option for act 117. Act 117B is a UV treatment. In some embodiments, UV treatment 117B is provided to cure low-k dielectric layer 223, however, UV treatment 117B can also cause a chemical transformation within transformative layer 213. In some embodiments, UV treatment 117B can produce energetic oxygen and or nitrogen ions or radicals that diffuse into and react within transformative layer 213 causing it to undergo a volume-increasing transformation. UV treatment 117B can employ any suitable conditions. Examples of conditions that can be suitable include temperatures in the range from 200 to 500° C. with wavelengths in the range from about 200 nm to about 400 nm. UV treatment 117B may be enhanced by the presence of one or more inert gases. In some embodiments, UV treatment 117B includes providing one or more gases that react to cause a chemical transformation within transformative layer 213. Examples of gases that can be suitable for these embodiments include oxygen sources such as $O_2$ and $O_3$ and nitrogen sources such as $N_2$.

Figure 9:
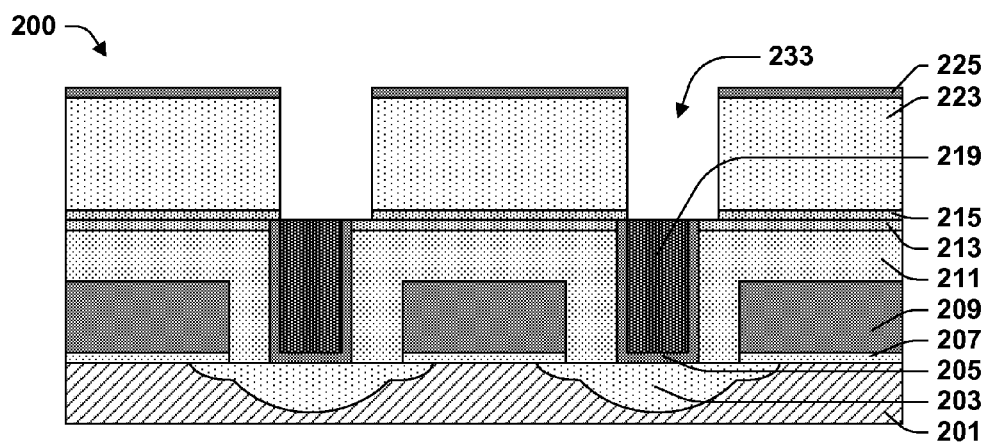

Process 100 continues with act 119, which forms a mask 225 over low-k dielectric 223. The mask 225 has openings corresponding to desired locations for contacts with metal plugs 219. Act 121 etches low-k dielectric 223 through an opening in mask 225 to form contact holes 233 as shown in FIG. 9 for the case in which etch stop layer 215 has been formed and as shown in FIG. 13 for the case in which etch stop layer 215 has not been formed. In most embodiments, the etch process of act 121 is a plasma etch. Any suitable etch conditions can be used. The etch gas can have any suitable chemistry. Examples of chemistries that may be suitable include, without limitation, $CHF_3/O_2$ and $C_xF_y/O_2$.

The etch process of act 121 exposes metal plugs 219. If etch stop layer 215 is present, act 121 generally etches through that layer. Transformative layer 213 provides an etch stop for act 121. While etch stop layer 215, if present, can facilitate avoidance of over etching at 121, transformed layer 213 still provides the etch stop. Transformative layer 213 can prevent over etching at locations where contact holes 233 extend outside metal plugs 219. In some embodiments, contact holes 233 extend outside metal plugs 219 because they are wider than metal plugs 219. Contact holes 233 may also extend outside metal plugs 219 because they are not perfectly aligned with metal plugs 219.

Figure 10:
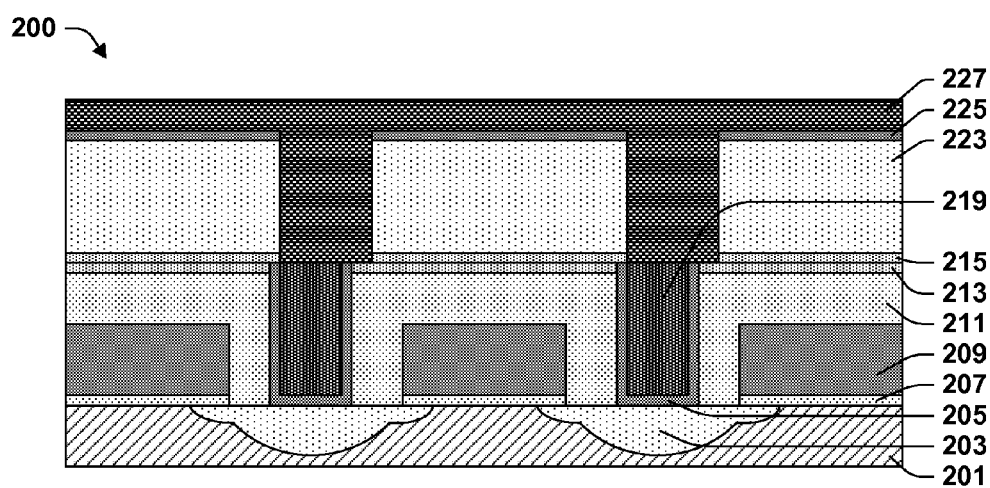

Process 100 continues with act 123 which fills contact holes 233 with a metal 227 that makes contact with metal plugs 219 as shown in FIG. 10. Metal 227 can be any suitable metal. In some embodiments, metal 227 is copper. In such instances, a diffusion barrier layer such as TiN may initially be formed to line the contact holes 233 prior to forming the copper layer. Act 125 is additional processing as necessary to complete formation of the device 200.

Some embodiments of the present disclosure relate to an integrated circuit device. The integrated circuit device includes a semiconductor substrate, and an inter-level dielectric layer arranged over the semiconductor substrate. An etch-stop layer is arranged over the inter-level dielectric layer. The etch-stop layer comprises silicon oxide, silicon nitride, or silicon oxynitride, and has a density greater than or equal to 2.15 g/cm$^3$.

Some embodiments of the present disclosure relate to an integrated circuit device including a semiconductor substrate, an inter-level dielectric layer over the semiconductor substrate, and a compressed dielectric layer over the inter-level dielectric layer. The compressed dielectric layer is under sufficient compressive stress to significantly increase its density and resistance to plasma etching.

Other embodiments of the present disclosure relate to an integrated circuit device. The integrated circuit device includes a semiconductor substrate, and an inter-level dielectric layer disposed over the semiconductor substrate. An etch-stop layer, which comprises silicon oxide, silicon nitride, or silicon oxynitride, is disposed directly over the inter-level dielectric layer. The etch-stop layer has a density greater than or equal to 2.15 g/cm$^3$. A protective layer is disposed directly over an upper surface of the etch-stop layer, and a low-k dielectric layer is disposed directly over an upper surface of the protective layer. A metal plug extends downwardly through the inter-level dielectric layer and the etch-stop layer to a source/drain region within the semiconductor substrate. A copper via extends downwardly through the low-k dielectric layer to connect with the metal plug.

The components and features of the present disclosure have been shown and/or described in terms of certain embodiments and examples. While a particular component or feature, or a broad or narrow formulation of that component or feature, may have been described in relation to only one embodiment or one example, all components and features in either their broad or narrow formulations may be combined with other components or features to the extent such combinations would be recognized as logical by one of ordinary skill in the art.

The invention claimed is:

1. An integrated circuit device, comprising:
   a semiconductor substrate;
   an inter-level dielectric layer arranged over the semiconductor substrate; and
   an etch-stop layer arranged over the inter-level dielectric layer and having a lower surface that directly contacts an upper surface of the inter-level dielectric layer, the etch-stop layer comprising silicon oxide, silicon nitride, or silicon oxynitride, and having a density greater than or equal to 2.15 g/cm$^3$;
   a protective layer arranged over the etch stop layer and having a lower surface that directly contacts an upper surface of the etch stop layer and having an upper surface that directly contacts a low-k dielectric layer; and
   a conductive plug extending downward though the inter-level dielectric layer and having an upper surface that is co-planar with the lower surface of the protective layer.

2. The integrated circuit device of claim 1, wherein a ratio of a combined oxygen and nitrogen content in the etch-stop layer to a silicon content in the etch-stop layer is less than 0.33.

3. The integrated circuit device of claim 1,
   wherein the conductive plug is ohmically coupled to a doped region in the semiconductor substrate; and further comprising:
   a via extending through the low-k dielectric layer and ohmically coupled to the conductive plug.

4. The integrated circuit device of claim 1, wherein the protective layer is configured to apply a compressive stress to the etch-stop layer.

5. The integrated circuit device of claim 1, further comprising:
   a gate electrode disposed over the semiconductor substrate;
   a first source/drain region and a second source/drain region disposed within the semiconductor substrate on opposite sides of the gate electrode;
   wherein the inter-level dielectric layer is in direct contact with the gate electrode and is a lowermost inter-level dielectric in an interconnect structure over the substrate.

6. The integrated circuit device of claim 1, wherein a thickness of the protective layer is less than 300 angstroms.

7. The integrated circuit device of claim 1, further comprising:
   a diffusion barrier lining an opening in the inter-level dielectric and separating the conductive plug from the inter-level dielectric, wherein the diffusion barrier has an upper surface that is co-planar with the lower surface of the protective layer.

8. An integrated circuit device, comprising:
   a semiconductor substrate;
   an inter-level dielectric layer over the semiconductor substrate;
   a compressed dielectric layer over the inter-level dielectric layer and having a lower surface that directly contacts an upper surface of the inter-level dielectric layer, the compressed dielectric layer being under sufficient compressive stress to significantly increase its density and resistance to plasma etching;
   a protective layer arranged over the compressed dielectric layer and having a lower surface that directly contacts an upper surface of the compressed dielectric layer and having an upper surface that directly contacts a low-k dielectric layer; and
   a conductive plug extending downward though the inter-level dielectric layer and ohmically coupled to a doped region in the semiconductor substrate, the conductive plug having an upper surface that is co-planar with a lower surface of the protective layer.

9. The integrated circuit device of claim 8,
   wherein an upper surface of the conductive plug is coplanar with an upper surface of the compressed dielectric layer.

10. The integrated circuit device of claim 8, wherein the compressed dielectric layer is under compressive stress exerted by the inter-level dielectric layer and by the low-k dielectric layer disposed over the compressed dielectric layer.

11. The integrated circuit device of claim 10, wherein the compressed dielectric layer is a silicon compound with oxygen or nitrogen or both oxygen and nitrogen.

12. The integrated circuit device of claim 11, wherein a ratio of a combined oxygen and nitrogen content to a silicon content is less than 0.33.

13. The integrated circuit device of claim 10, further comprising:
   metal plugs disposed within the inter-level dielectric layer; and
   copper vias disposed within the low-k dielectric layer disposed above the compressed dielectric layer;
   wherein the copper vias connect with the metal plugs; and
   wherein the compressed dielectric layer is at a same height above the semiconductor substrate as a height at which the copper vias connect with the metal plugs.

14. The integrated circuit device of claim 8, wherein:
   the low-k dielectric layer comprises SiC and SiO; and
   a ratio of SiO to SiC ratio within the low-k dielectric layer is 2:1 or less.

15. The integrated circuit device of claim 8, wherein the low-k dielectric layer is a product of a flowable low-k dielectric formation process.

16. The integrated circuit device of claim 8, wherein the compressed dielectric layer comprises silicon oxide, silicon nitride, or a silicon oxynitride and has a density greater than or equal to 2.15 g/cm$^3$.

17. The integrated circuit device of claim 8, wherein the compressed dielectric layer has a thickness ranging between 50 and 300 Angstroms.

18. The integrated circuit device of claim 8, further comprising:
- a diffusion barrier lining sidewalls and a lower portion of an opening in the inter-level dielectric, wherein the diffusion barrier is directly over the doped region and separates the conductive plug from both the inter-level dielectric and the doped region, wherein the diffusion barrier has an upper surface that is co-planar with the lower surface of the protective layer.

19. An integrated circuit device comprising:
- a semiconductor substrate;
- a gate electrode disposed over the semiconductor substrate;
- a first source/drain region and a second source/drain region disposed within the semiconductor substrate on opposite sides of the gate electrode;
- a first inter-level dielectric layer disposed over the gate electrode and in direct contact with the gate electrode;
- an etch-stop layer comprising silicon oxide, silicon nitride, or silicon oxynitride and in direct contact with the first inter-level dielectric layer, the etch-stop layer having a density greater than or equal to 2.15 g/cm$^3$;
- a protective layer disposed directly over an upper surface of the etch-stop layer;
- a metal plug extending downwardly through the first inter-level dielectric layer and the etch-stop layer to the first source/drain region or the second source/drain region wherein the metal plug has an upper surface that is co-planar with a lower surface of the protective layer;
- a second inter-level dielectric layer disposed over the etch stop layer and making direct contact with the etch stop layer; and
- a copper via extending downwardly through the second inter-level dielectric layer to connect with the metal plug.

20. The integrated circuit device of claim 19, further comprising:
- a diffusion barrier lining sidewalls and a lower portion of an opening in the first inter-level dielectric layer, wherein the diffusion barrier is directly over the first source/drain region or the second source/drain region and separates the metal plug from both the first inter-level dielectric layer and the first source/drain region or the second source/drain region, and wherein the diffusion barrier has an upper surface that is co-planar with the lower surface of the protective layer.

* * * * *